(12) United States Patent
Hermenau et al.

(10) Patent No.: US 12,123,394 B2
(45) Date of Patent: Oct. 22, 2024

(54) COLUMN HAVING AT LEAST ONE PHOTOVOLTAIC ELEMENT, AND USE OF A PHOTOVOLTAIC ELEMENT ON A COLUMN

(71) Applicant: HELIATEK GMBH, Dresden (DE)

(72) Inventors: Martin Hermenau, Dresden (DE); Hannes Krenz, Dresden (DE); Spyridon Christaras, Dresden (DE)

(73) Assignee: HELIATEK GMBH, Dresden (DE)

( * ) Notice: Subject to any disclaimer, the term of this patent is extended or adjusted under 35 U.S.C. 154(b) by 67 days.

(21) Appl. No.: 17/611,585

(22) PCT Filed: May 17, 2020

(86) PCT No.: PCT/DE2020/100429
§ 371 (c)(1),
(2) Date: Feb. 8, 2022

(87) PCT Pub. No.: WO2020/233748
PCT Pub. Date: Nov. 26, 2020

(65) Prior Publication Data
US 2022/0228564 A1    Jul. 21, 2022

(30) Foreign Application Priority Data

May 17, 2019    (DE) .................. 10 2019 113 016.6

(51) Int. Cl.
*F03D 13/20* (2016.01)
*F03D 9/00* (2016.01)
*H01L 31/042* (2014.01)
*H02S 10/12* (2014.01)
*H02S 20/10* (2014.01)

(52) U.S. Cl.
CPC ............. *F03D 13/20* (2016.05); *F03D 9/007* (2013.01); *H01L 31/042* (2013.01); *H02S 10/12* (2014.12); *H02S 20/10* (2014.12); *F05B 2220/708* (2013.01); *F05B 2240/912* (2013.01);
(Continued)

(58) Field of Classification Search
CPC . F03D 13/20; F03D 9/007; F03D 9/25; H01L 31/042; H02S 10/12; H02S 20/10; H02S 20/20; F05B 2220/708; F05B 2240/912; F05B 2250/232; F05B 2260/30;
(Continued)

(56) References Cited

U.S. PATENT DOCUMENTS 4,281,369 A  *  7/1981  Batte .................. F21S 9/035
                                              362/276
5,254,876 A     10/1993  Hickey
(Continued)

FOREIGN PATENT DOCUMENTS

CN    104779896 A    7/2015
CN    104948380 A    9/2015
(Continued)

*Primary Examiner* — Hoang M Nguyen
(74) *Attorney, Agent, or Firm* — LEYDIG, VOIT & MAYER, LTD.

(57) ABSTRACT

A column with at least one photovoltaic element for converting radiation energy is disclosed. The at least one photovoltaic element converts radiation energy of light, such as sunlight, into electrical energy. The at least one photovoltaic element is arranged on the column, and at least one photovoltaic element is a flexible photovoltaic element.

12 Claims, 3 Drawing Sheets

(52) U.S. Cl.
CPC ..... *F05B 2250/232* (2013.01); *F05B 2260/30* (2013.01); *Y02B 10/30* (2013.01); *Y02E 10/50* (2013.01)

(58) Field of Classification Search
CPC . F05B 2280/5001; Y02B 10/30; Y02E 10/50; Y02E 10/728; E04H 12/00
See application file for complete search history.

(56) References Cited

U.S. PATENT DOCUMENTS

| | | | |
|---|---|---|---|
| 6,060,658 A * | 5/2000 | Yoshida | G09F 13/02 52/173.3 |
| 7,045,702 B2 | 5/2006 | Kashyap | |
| 7,932,621 B1 | 4/2011 | Spellman | |
| 8,288,884 B1 | 10/2012 | Malcolm | |
| 2007/0090371 A1 | 4/2007 | Drechsel et al. | |
| 2009/0217980 A1 | 9/2009 | Pfeiffer et al. | |
| 2010/0207453 A1 | 8/2010 | Ottman | |
| 2011/0017256 A1 * | 1/2011 | Stevens | H02S 20/00 136/244 |
| 2012/0118853 A1 | 5/2012 | Ogasawara et al. | |
| 2012/0126213 A1 | 5/2012 | Gresser et al. | |
| 2013/0038124 A1 * | 2/2013 | Newdoll | H02J 13/00028 307/31 |
| 2013/0104968 A1 | 5/2013 | Pfeiffer et al. | |
| 2013/0160829 A1 | 6/2013 | Uhrich et al. | |
| 2013/0335956 A1 * | 12/2013 | Scott | H02S 20/10 136/251 |
| 2016/0020419 A1 | 1/2016 | Walzer et al. | |
| 2016/0036224 A1 * | 2/2016 | Kornovich | H02S 20/20 307/18 |
| 2016/0141497 A1 | 5/2016 | Weiss et al. | |
| 2017/0331426 A1 | 11/2017 | Petrova-Koch et al. | |
| 2019/0006599 A1 | 1/2019 | Hildebrandt et al. | |
| 2019/0019957 A1 | 1/2019 | Hildebrandt et al. | |
| 2020/0153380 A1 | 5/2020 | Hildebrandt et al. | |
| 2021/0092908 A1 * | 4/2021 | Parker-Swift | A01G 9/243 |

FOREIGN PATENT DOCUMENTS

| | | |
|---|---|---|
| CN | 107004728 A | 8/2017 |
| DE | 202012007048 U1 | 11/2012 |
| DE | 202012010654 U1 | 2/2013 |
| DE | 102016015436 A | 6/2018 |
| EP | 1818605 A2 | 8/2007 |
| EP | 3187496 A1 | 7/2017 |
| EP | 3188270 B1 | 12/2018 |
| JP | 2010090886 A | 4/2010 |
| WO | WO 2004083958 A2 | 9/2004 |
| WO | WO 2006092134 A1 | 9/2006 |
| WO | WO 2010133208 A1 | 11/2010 |
| WO | WO 2011013219 A1 | 2/2011 |
| WO | WO 2011138021 A2 | 11/2011 |
| WO | WO 2011161108 A1 | 12/2011 |
| WO | WO 2014128278 A1 | 8/2014 |
| WO | WO 2014206860 A1 | 12/2014 |
| WO | 2016/131685 A1 | 8/2016 |

* cited by examiner

COLUMN HAVING AT LEAST ONE PHOTOVOLTAIC ELEMENT, AND USE OF A PHOTOVOLTAIC ELEMENT ON A COLUMN

CROSS-REFERENCE TO PRIOR APPLICATIONS

This application is a U.S. National Phase application under 35 U.S.C. § 371 of International Application No. PCT/DE2020/100429, filed on May 17, 2020, and claims benefit to German Patent Application No. DE 10 2019 113 016.6, filed on May 17, 2019. The International Application was published in German on Nov. 26, 2020 as WO 2020/233748 A1 under PCT Article 21(2).

FIELD

The present invention relates to columns with at least one flexible photovoltaic element, in particular a solar cell, for converting radiation energy of light into electrical energy, to wind turbine structures for converting flow energy of wind into electrical energy with at least one flexible photovoltaic element, in particular a solar cell, for converting radiation energy of light into electrical energy, and to the use of at least one flexible photovoltaic element, in particular a solar cell, on a column or on a wind turbine structure.

BACKGROUND

The generation of electrical energy from renewable sources plays an increasingly important role, with the generation of electrical energy from solar energy and wind power being of particular importance.

The use of solar cells to generate electrical energy from light is known from the prior art. Solar cells are known in various embodiments. Solar cells are made from a photoactive layer, which is usually integrated in a frame. Such solar panels can be attached to buildings, in particular on roofs, or in open areas.

The use of wind turbine structures to generate electrical energy from wind power is likewise known from the prior art. Wind turbine structures are formed from a column set up in the vertical direction with a turbine with rotor blades that is arranged at one end of said column.

It is likewise known to use wind turbine structures and solar cells together to generate electrical energy. Numerous rotor blades for wind turbine structures with solar cells are known from the prior art.

U.S. Pat. No. 5,254,876 A discloses the combination of wind turbine structures and solar cells arranged on rotor blades of the wind turbine structure.

U.S. Pat. No. 7,045,702 A discloses a windmill with solar panels, wherein the solar panels are arranged on the blades of the windmill.

U.S. Pat. No. 8,288,884 B1 discloses a wind turbine structure with integrated solar panels, wherein the solar panels are attached to a tower of the wind turbine structure. The solar panels are attached to the tower by means of an additional construction, wherein the solar panels are displaceable and/or inclinable.

SUMMARY

In an embodiment, the present invention provides a column with at least one photovoltaic element for converting radiation energy of light, such as sunlight, into electrical energy, wherein the at least one photovoltaic element is arranged on the column, and wherein the at least on ephotovoltaic element is a flexible photovoltaic element.

DETAILED DESCRIPTION

Figure 1:
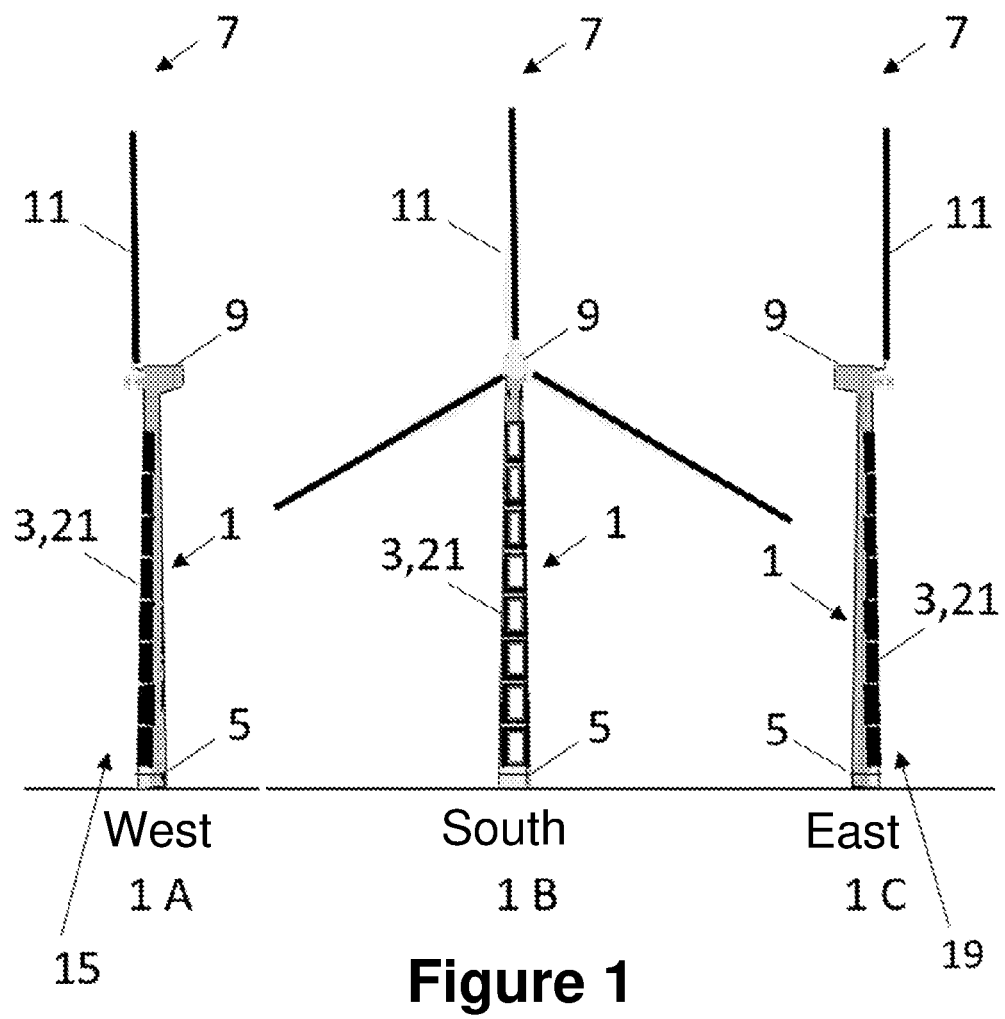
FIG. 1 shows a schematic illustration of a first embodiment of a wind turbine structure with flexible photovoltaic elements in a front view (FIG. 1B) and two side views (FIGS. 1A and 1C)

The objective of the present invention is to provide a column with at least one photovoltaic element and a wind turbine structure with such a column, wherein the disadvantages mentioned below do not occur, and wherein in particular the surface of a column, in particular of the column of a wind turbine structure, can be used more effectively for generating energy, and wherein in particular a better efficiency is achieved when individual cells are partially and/or fully shaded.

The disadvantage of the prior art, however, is that the solar cells are not form-fitting and are therefore arranged directly on a surface of a column. Solar panels that are arranged in particular in a solid frame on the surface of the column protrude with a large part of their surface from the column. As a result, the solar panels are particularly susceptible to damage from the effects of weather, in particular strong wind, and influence the flow of the wind at the rotor blades, as a result of which the effectiveness of the wind turbine structure is considerably reduced. Likewise, the solar cells attached to rotor blades or the solar panels attached to the blades are exposed to even stronger forces due to the rotation and influence the flow of the wind at the rotor blades.

The combinations of wind turbine structures and photovoltaic systems known from the prior art are thus disadvantageous insofar as the effectiveness of the wind turbine structure is impaired. However, the prior art does not disclose columns on which photovoltaic elements are arranged in a form-fitting manner on the surface of a column, in particular are adhesively bonded thereto.

The invention is therefore based on the object of providing a column with at least one photovoltaic element for converting radiation energy of light, in particular sunlight, into electrical energy and/or a wind turbine structure with such a column, wherein the disadvantages mentioned do not occur, and wherein in particular a column can be used effectively for generating energy, and in particular the effectiveness of a wind turbine structure is not impaired.

The object is achieved by the subjects of the independent claims. Advantageous embodiments become apparent from the dependent claims.

The object is achieved in particular by providing a column with at least one photovoltaic element for converting radiation energy of light, in particular sunlight, into electrical energy, wherein the at least one photovoltaic element is arranged on the column, and wherein the at least one photovoltaic element is a flexible photovoltaic element.

In a preferred embodiment, the photovoltaic element is connected to the column in a form-fitting manner, in particular is attached in a form-fitting manner to the surface of the column. In a preferred embodiment, the at least one photovoltaic element is fixed in a form-fitting manner on the column in such a way that the at least one photovoltaic element is at least largely protected from weather influences, in particular hail, snow or wind. This is particularly advantageous when installing the at least one photovoltaic element on a wind turbine structure, since the latter is deliberately installed in an area with frequent and stronger winds. The column according to the invention with the at least one photovoltaic element has advantages over the prior art. An effective combination of the generation of electrical energy from wind energy and the generation of electrical energy from solar energy is advantageously made possible. The surface of the column is advantageously used effectively, in particular since no frames of conventional photovoltaic elements hinder the attachment of further photovoltaic elements. Advantageously, it is possible to dispense with further components, such as a frame or a framework for stabilizing and/or attaching the photovoltaic element, in particular by means of a form-fitting attachment of the photovoltaic element directly to the surface of the column. The solar cells are advantageously attached to the column in a form-fitting manner and are therefore less susceptible to damage from wind or other weather influences. Noise generated by the wind is advantageously reduced in comparison with solar panels that usually protrude. Advantageously, existing surfaces of the column are used for arranging the photovoltaic elements, and therefore no additional surface is required. The photovoltaic elements are advantageously adapted to the shape of the column, as a result of which greater stability with regard to strong winds and damage caused thereby is achieved. The flexible photovoltaic elements are advantageously particularly lightweight, as a result of which a larger number of photovoltaic elements are attachable to the column without exceeding a specific weight.

A column is also understood to mean in particular a pillar, in particular a bridge or supporting pillar, a tower, in particular a chimney, a flue, a transmission or power mast or a television tower, or a silo or a telephone, telegraph or overhead line or lamp post or pylon. In a preferred embodiment, the column is a column of a wind turbine structure.

A photovoltaic element is understood to mean in particular an optoelectronic cell or a solar cell. The photovoltaic element is in particular a module made up of a plurality of cells which can be connected in series or in parallel, wherein preferably one cell has its longest extent over the length of the module or over the width of the module.

In a preferred embodiment, the flexible photovoltaic element is a flexible solar cell, in particular a CIS, CIGS, GaAs or Si cell, a perovskite cell or an organic photovoltaic element (OPV), in particular a polymeric organic photovoltaic element or an organic photovoltaic element based on small molecules. The photovoltaic element is particularly preferably a flexible organic photovoltaic element (OPV) based on small molecules.

An organic photovoltaic element (OPV) is understood to mean in particular a photovoltaic element with at least one organic photoactive layer.

Small molecules are understood to mean in particular non-polymeric organic molecules with monodisperse molar masses of between 100 and 2000 g/mol, which are in the solid phase under normal pressure (air pressure of the surrounding atmosphere) and at room temperature. In particular, the small molecules are photoactive, with photoactive being understood to mean that the molecules change their charge state and/or their polarization state when light is introduced.

In a preferred embodiment, the organic photovoltaic element is formed from at least one cell. In a preferred embodiment, the cell is designed as a single cell, tandem cell, or multicell. Tandem cells and multicells consist of at least two cells arranged one above another between the electrodes, wherein each cell comprises at least one photoactive layer. The term photoactive layer is understood to mean the layer or the layer stack within a cell that makes a contribution to the generation of the charge carriers in an organic photovoltaic element. The organic photovoltaic element can therefore also have further layers, for example charge carrier transport layers, which may be doped. One possible design of organic photovoltaic elements is disclosed in WO 2004 083 958 A2, WO 2011 013 219 A1, WO 2011 138 021 A2, and WO 2011 161 108 A1.

In a preferred embodiment, the photoactive layer has small molecules.

In one embodiment, a plurality of cells are arranged next to one another as strips with contacts and are connected in series. Each cell has its own base electrode and top electrode. The series connection is realized, for example, by electrically connecting the base electrode of one cell to the top electrode of the next cell. In one embodiment, each cell or a group of cells is assigned an integrated bypass diode or an element for avoiding losses in the event of shading.

In one embodiment, the photoactive layer comprises absorber materials which are evaporable and applied to a carrier film by evaporation. For this purpose, materials belonging to the group of "small molecules" are used, which are described, inter alia, in WO 2006 092 134 A1, WO 2010 133 208 A1, WO 2014 206 860 A1, WO 2014 128 278 A1, EP 31 87 496 A1, and EP 31 88 270 B1.

In a preferred embodiment, the at least one photovoltaic element is additionally provided with and/or encapsulated in at least one applied barrier layer in order to minimize degradation due to external influences. Furthermore, a passivation layer can be applied to protect the at least one photoactive layer and/or a planarization layer can be applied.

A flexible photovoltaic element is understood to mean in particular a photovoltaic element that is bendable and/or stretchable in a specific region.

In a preferred embodiment, the flexible photovoltaic element has a bending radius of less than 50 cm, preferably less than 20 cm, or preferably less than 10 cm, or preferably less than 5 cm. The flexibility of the flexible photovoltaic element is preferably characterized by the bending radius. This ensures that the flexible photovoltaic element is adaptable to the shape of the surface of the column.

In a preferred embodiment, the flexible photovoltaic element has a positive temperature coefficient. As a result, the flexible photovoltaic element can be arranged in a form-fitting manner and thus directly on the surface of the column, since no distance is necessary for rear ventilation of the flexible photovoltaic element.

A longitudinal direction is understood to mean in particular the direction of the longest extent of a column or a photovoltaic element, in particular the longitudinal direction is the longest extent of a column of a wind turbine structure, on which a photovoltaic element is arranged. The longitudinal direction is, in particular, the direction in which a column is properly set up, that is to say the vertical direction.

A transverse direction is understood to mean in particular the direction perpendicular to the longitudinal direction, that is to say the horizontal direction.

In a preferred embodiment, the at least one photovoltaic element is arranged vertically and/or horizontally on the column, based on the longest extent of the photovoltaic element and/or the arrangement of the cells in the photovoltaic element.

According to a development of the invention, provision is made for the at least one flexible photovoltaic element to be arranged transversely and/or longitudinally, and/or also obliquely, relative to the longest extent of the column. The at least one photovoltaic element can be arranged here on differently designed columns.

In a preferred embodiment, the at least one photovoltaic element extends at least largely over the entire length of the column.

In a preferred embodiment, the length of the column is 2 m, preferably 3 m, preferably 5 m, preferably 10 m, preferably 20 m, preferably 30 m, preferably 50 m, preferably 80 m, preferably 100 m, preferably 120 m or more.

According to a development of the invention, provision is made for the column to have at least two rows of flexible photovoltaic elements, wherein the at least two rows of flexible photovoltaic elements are arranged transversely and/or longitudinally, and/or even obliquely, relative to the longest extent of the column, and wherein a row preferably has at least two flexible photovoltaic elements.

In a preferred embodiment, the at least one photovoltaic element is arranged vertically and/or horizontally in relation to the longitudinal direction of the column.

In a preferred embodiment, the width of the at least one photovoltaic element is greater than 20 cm, preferably greater than 30 cm, preferably greater than 50 cm, preferably greater than 60 cm, preferably greater than 80 cm, or preferably greater than 1 m.

In a preferred embodiment, the length of the at least one photovoltaic element is greater than 2 m, preferably greater than 5 m, preferably greater than 6 m, or preferably greater than 10 m.

In a particularly preferred embodiment, the length of the at least one photovoltaic element is adapted to the extent of the column, so that the surface of the column is at least largely used. In a preferred embodiment, the lengths of a plurality of photovoltaic elements attached to the column differ.

In a preferred embodiment, a multiplicity of photovoltaic elements are arranged on the column, in particular the photovoltaic elements are arranged flush relative to one another. In a preferred embodiment, the photovoltaic elements are arranged parallel to one another on the column. In a preferred embodiment, the column is completely or largely completely coated with photovoltaic elements.

According to a development of the invention, provision is made for the column to have a conical shape, wherein a diameter of the column decreases at least in part from the bottom to the top (in the longitudinal direction of the column). In an alternative embodiment, the column is cylindrical. In an alternative embodiment, the cross section of a column is represented by an area enclosed by a curved line.

In a preferred embodiment, the at least one photovoltaic element is designed as a flexible film coated with at least one photoactive layer, wherein the flexible film is preferably adaptable to a surface, in particular is stretchable within specific limits, so that differences in the length and/or width are compensable.

In a preferred embodiment, the diameter of the column is smaller than its extent in the longitudinal direction. In a preferred embodiment, the column has a diameter of at least 8 cm, preferably at least 10 cm, preferably at least 30 cm, preferably at least 50 cm, preferably at least 70 cm, preferably at least 1 m, or preferably at least 2 m.

According to a development of the invention, provision is made for the at least one flexible photovoltaic element to be attached to the column by an integral, in particular adhesive, bond. In a preferred embodiment, the at least one flexible photovoltaic element is fixed on the column.

In a preferred embodiment, the at least one photovoltaic element has a self-adhesive coating on the back, as a result of which the at least one photovoltaic element is attachable, in particular adhesively bondable, to a surface. In a preferred embodiment, the self-adhesive coating extends over the entire or at least largely over the entire back of the photovoltaic element. As a result, no additional framework and/or no frame is required for attaching the at least one photovoltaic element, as a result of which the installation of the at least one photovoltaic element is simpler and cheaper.

According to a development of the invention, provision is made for the flexible photovoltaic element to be attached to the column in a form-fitting manner.

The arrangement of the photovoltaic elements on the column, in particular the installation of the photovoltaic elements on the column, consists in particular of photovoltaic elements connected in series and/or in parallel.

According to a development of the invention, provision is made for the interconnection of the photovoltaic elements to be regionally separated from one another; preferably, photovoltaic elements aligned in a first compass direction on the column are separated from the interconnection on the column in a second compass direction, wherein preferably each interconnection is operated in an electrical working region, in particular an inverter is assigned in each case, in particular a 3-phase inverter. As a result, the generation of electrical energy due to the photovoltaic elements at different times of the day with correspondingly different solar irradiation is particularly effective.

In a preferred embodiment, the cables of the interconnection run horizontally and vertically between the photovoltaic elements.

In a preferred embodiment, the interconnection of photovoltaic elements aligned in the east-south/east direction on the column is separated from the interconnection of photovoltaic elements aligned in the west-south/west direction on the column. The compass direction refers to locations in Earth's Northern Hemisphere. The polarity conditions in the Southern Hemisphere are opposite to those in the Northern Hemisphere. In a preferred embodiment, the interconnection, in particular the cables of the interconnection, is at least partly fixed, in particular by means of magnetic attachments and/or cable ducts integrated into the surface of the column. The column preferably has at least one hole leading into the interior of the column, wherein the cables of the interconnection are led into the interior of the column. In a preferred embodiment, the interconnection of a plurality of photovoltaic elements is passed through the one hole. In a preferred embodiment, the column has a plurality of holes leading into the interior of the column. For each row of photovoltaic elements, one hole is preferably provided through which cables of an interconnection are led into the interior of the column.

In a preferred embodiment, the photovoltaic elements are arranged in dependence on the radiation of sunlight incident on the surface of the column, wherein the photovoltaic elements are preferably arranged on a side of the column facing strong incoming solar radiation.

In a preferred embodiment, the column has a storage unit for storing electrical energy, in particular an accumulator, which is operatively connected to the at least one photovoltaic element, with the result that the electrical energy generated by means of the at least one photovoltaic element is storable.

In a preferred embodiment, the column has at least one cavity, wherein cables, a converter, and/or the storage unit, in particular the accumulator, are arrangeable in the at least one cavity.

The photovoltaic element, in particular the solar cell, comprises at least one layer of an organic cell, at least two contacts, with a contact near the substrate being referred to as a base contact or base electrode and a contact remote from the substrate being referred to as a top contact or top electrode.

In a preferred embodiment, an arrangement of photovoltaic elements is installed, which can be partly shaded during use, wherein in particular an improved efficiency and a longer service life of the photovoltaic elements is made possible despite the partial shading.

In a preferred embodiment, the at least one photovoltaic element has an integrated bypass diode, wherein the bypass diode is printed or vapor-deposited on the cells of the photovoltaic element. The bypass diode is sandwiched between a common base contact and a top contact. In particular in the case of partial shading of individual photovoltaic elements, for example in the case of partial shading caused by the rotor blades of a wind turbine structure, this prevents the shaded cells from representing reverse-biased diodes with respect to the unshaded or less shaded cells connected in series therewith, thus avoiding the outflow of electrical energy being prevented, which has a negative effect on the efficiency of the modules.

In a preferred embodiment, the bypass diode is arranged in parallel with a plurality of optoelectronic cells. As a result, in the event of (partial) shading, when the current flow in the cell decreases, a higher current flow in the reverse direction of the cell is made possible at a given voltage.

In a preferred embodiment, the bypass diodes are arranged in parallel with the strips of the optoelectronic cells or are integrated into the strips of the optoelectronic cells.

In a preferred embodiment, the photovoltaic elements are connected via inverters.

The object of the present invention is also achieved by providing a wind turbine structure for converting the flow energy of wind into electrical energy with a column according to the invention with at least one photovoltaic element for converting the radiation energy of light into electrical energy, in particular according to one of the exemplary embodiments described above. The wind turbine structure has the column and a turbine portion with rotor blades, wherein the turbine portion is arranged at one end of the column, and wherein a generator is drivable by means of the turbine portion, wherein at least one flexible photovoltaic element is arranged on the column. This gives rise in particular to the advantages for the wind turbine structure that have already been described in connection with the column with the at least one photovoltaic element.

The prior art does not disclose any wind turbine structures that have flexible photovoltaic elements arranged in a form-fitting manner directly on the surface of the column of the wind turbine structure.

In a preferred embodiment, the photovoltaic element is designed as a system for generating energy from radiation energy of light. In a preferred embodiment, the wind turbine structure is designed as a system for generating electrical energy from wind power. In a preferred embodiment, the system for generating energy by way of the at least one photovoltaic element is coupled to the system for generating energy by way of the wind turbine structure.

The parallel generation of electrical energy from the wind turbine structure and the photovoltaic system is advantageously possible. Advantageously, the photovoltaic elements mounted in a form-fitting manner to the column do not cause any turbulence in the wind that would impair the generation of energy by the turbine portion with the rotor blades. Birds are advantageously kept away from the wind turbine structure, in particular by a mirror and/or color effect on the photovoltaic elements. The function of the rotor blades of the wind turbine structure is advantageously not impaired. The effectiveness of the wind turbine structures is advantageously increased by the combination with photovoltaic elements. The electrical energy generated by the photovoltaic elements can advantageously be used to operate the wind turbine structure, in particular when there is no wind.

A wind turbine structure is understood to mean, in particular, a wind wheel, a windmill or a wind power converter. The wind turbine structure converts wind energy, i.e. flow energy of the wind, into electrical energy, which is then feedable into a power grid. The wind turbine structure can be attached to the corresponding location in a manner known to a person skilled in the art.

In a preferred embodiment, the energy generated by means of the at least one photovoltaic element can be used to operate the wind turbine structure, in particular to start the turbine portion, to support the turbine portion, for illumination and/or for a control device.

In a preferred embodiment, the turbine portion is arranged on the column so that it is rotatable relative to the column.

In a preferred embodiment, the turbine portion is operatively connected to a generator, with the result that the wind power can be converted into electrical energy.

According to a development of the invention, provision is made for the at least one photovoltaic element to be at least regionally arranged transversely around the longitudinal axis of the column, preferably around the entire longitudinal axis of the column. The at least one photovoltaic element, in particular the photovoltaic element arranged transversely around the longitudinal axis of the column, is preferably adhesively bonded to the surface of the column.

According to a development of the invention, provision is made for the wind turbine structure to have a multiplicity of flexible photovoltaic elements, wherein in particular a first interconnection of flexible photovoltaic elements attached to the surface of the column in a first compass direction is separated from a second interconnection of flexible photovoltaic elements attached to the surface of the column in a second compass direction, in particular are not operatively connected to each other, wherein the two interconnections are preferably each operated in an electrical working region, in particular an inverter is assigned in each case, in particular a 3-phase inverter.

In a preferred embodiment, at least one photovoltaic element, in particular a solar cell, is additionally arranged on the rotor blades of the wind turbine structure.

In a preferred embodiment, the wind turbine structure is installed on land or on water, either floating or firmly connected to the ground. In a preferred embodiment, the wind turbine structure is installed on flat land or in a hilly landscape, in particular a mountain range.

The object of the present invention is also achieved by providing the use of at least one flexible photovoltaic element on a column or the use of at least one flexible photovoltaic element on a wind turbine structure, in particular according to one of the exemplary embodiments described above. The use of the at least one flexible photovoltaic element on the column and the use of the at least one flexible photovoltaic element on the wind turbine structure give rise in particular to the advantages that have already been described in connection with the column and/or the wind turbine structure.

EXEMPLARY EMBODIMENTS

FIG. 1 shows a schematic illustration of a first embodiment of a wind turbine structure 7 according to the invention with a column 1 with flexible photovoltaic elements 3 in a front view (FIG. 1B) and two side views (FIGS. 1A and 1C).

In the present exemplary embodiment, the column 1 is a column 1 of a wind turbine structure 7. The column 1 can, however, also be a column 1 that is independent of the wind turbine structure 7. The column 1 can be made of wood, steel, in particular a steel framework, and/or concrete.

The column 1 has photovoltaic elements 3, in particular solar cells 21, for converting radiation energy of light, in particular sunlight, into electrical energy, wherein the photovoltaic elements 3 are arranged on the column 1. The photovoltaic elements 3 are flexible photovoltaic elements 3, in particular organic photovoltaic elements 3 on the basis of small molecules. In this exemplary embodiment, the photovoltaic elements 3 are adhesively bonded to the surface of the column 1. For this purpose, the photovoltaic elements 3 can be coated on the back with an adhesive.

The wind turbine structure 7 for converting the flow energy of wind into electrical energy with the column 1 with photovoltaic elements 3 for converting the radiation energy of light into electrical energy is shown in FIG. 1. The wind turbine structure 7 has the column 1 and a turbine portion 9 with rotor blades 11, wherein the turbine portion 9 is arranged at one end of the column 1. A generator is drivable by means of the turbine portion 9 and converts the wind energy into electrical energy. The generator can be arranged in the turbine portion 9 or in a cavity in the column 1. The photovoltaic elements 3 are flexible photovoltaic elements 3.

In the present exemplary embodiment, the flexible photovoltaic element 3, that is to say the solar cell 21, is a flexible organic photovoltaic element (OPV) on the basis of small molecules, but the use of other flexible photovoltaic elements 3 is also conceivable.

In the exemplary embodiment, the height of the column 1 of the wind turbine structure 7 is 80 m, but other heights are also conceivable. Furthermore, in the exemplary embodiment, solar cells 21 are arranged on the column 1 up to a height of 50 m, and the installation of the solar cells 21 begins at a height of approximately 3 m.

The dimensions of the solar cells 21 (HeliaSol® 308-5986) are 5.986×0.308 m, wherein for example a total of 120 such solar cells 21 are arranged on the column 1. However, the dimensions of the solar cells 21 can be adapted to the dimensions of the column 1. HeliaSol® modules each have two connections on the front of the modules. The azimuth of the modules is variable, and the inclination of the modules on the surface of the column 1 is 90°. The widths of the individual solar cells 21 arranged next to one another in the transverse direction are the same, but it is also conceivable to arrange solar cells 21 having different widths next to one another. In the present exemplary embodiment, eight rows with solar cells 21 are arranged next to one another in the longitudinal direction of the column 1.

In this exemplary embodiment, the solar cells 21 are arranged around the column 1 in the transverse direction, that is to say in the transverse direction of the cells of the element relative to the longitudinal direction of the column 1.

In an alternative exemplary embodiment, the solar cells 21 are arranged on the column 1 in the longitudinal direction, that is to say parallel relative to the longitudinal direction of the column 1.

In an embodiment of the invention, the flexible photovoltaic elements 3 are arranged transversely and/or longitudinally, in particular also obliquely, relative to the longest extent of the column 1.

In an further embodiment of the invention, the column 1 has a plurality of rows of flexible photovoltaic elements 3, wherein the plurality of rows of flexible photovoltaic elements 3 are arranged transversely and/or longitudinally, in particular also obliquely, relative to the longest extent of the column 1, and wherein a row has at least two flexible photovoltaic elements 3.

In the present exemplary embodiment, the column 1 has a conical shape, wherein a diameter 5 of the column 1 decreases at least partially from the bottom to the top.

In the present exemplary embodiment, with such a conical profile of the diameter of the column 1, the number of the photovoltaic elements 3 arranged next to one another in the transverse direction decreases from the bottom to the top in the longitudinal direction of the column 1. Alternatively, it is conceivable to adapt the dimensions of the photovoltaic elements 3 to the diameter of the column 1.

In an further embodiment of the invention, the flexible photovoltaic elements 3 are at least regionally arranged transversely around the longitudinal axis of the column 1, preferably around the entire longitudinal axis of the column 1.

In an further embodiment of the invention, the flexible photovoltaic elements 3 are attached in a form-fitting manner to the column 1 by the photovoltaic elements 3 being adhesively bonded to the surface of the column 1.

In the present exemplary embodiment, a first interconnection 13 of flexible photovoltaic elements 3 attached to the surface of the column 1 in a first compass direction 15 (see FIGS. 1A and 1B) is separated from a second interconnection 17 of flexible photovoltaic elements 3 attached to the surface of the column 1 in a second compass direction 19 (see FIGS. 1B and 1C), wherein the two interconnections 13, 17 are each operated in an electrical working region, in particular an inverter is assigned in each case.

In the present exemplary embodiment, the interconnection 17 of the solar cells 21 arranged in the east-south/east direction is separated from the interconnection 13 of the solar cells 21 arranged in the west-south/west direction. Owing to the separate interconnections 13, 17 in dependence on the compass directions 15, 19, the column 1 is divided into two regions, one region facing the east-south/east direction and one region facing the west-south/west direction (based on the compass directions on locations in Earth's Northern Hemisphere). The inverter assigned to each of these regions is connected to sixty solar cells 21. The inverters are two MPPT (maximum power point tracking) inverters with three phases. The maximum output of the inverters is 4.68 kW. The voltage range is a minimum of 200 V and a maximum of 495.6 V, and the maximum current strength is 16.3 A per inverter and 9.78 A per MPPT.

In an embodiment of the invention, the interconnection 13, 17, in particular the course of a cable of the interconnection 13, 17, is arranged at least partly horizontally and vertically between the photovoltaic elements 3.

In an further embodiment of the invention, cable ducts in which the cables are guided are arranged in the surface of the column 1.

In the present exemplary embodiment, the solar cells 21 are arranged on the column 3 in the compass directions east (FIG. 1 A), south (FIG. 1 B) and west (FIG. 1 C), while no solar cell 21 is arranged in the north direction. As a result, the solar cells 21 are particularly well aligned according to the incoming radiation of the sunlight. This is because a lower input of sunlight should be expected in the north direction. In an alternative exemplary embodiment, however, it is conceivable that the solar cells 21 are additionally arranged in the north direction, in particular in order to use and protect the surface of the entire column 1 as much as possible.

The connection of the solar cells 21 runs through cables guided externally in the transverse direction to the column 1 between the solar cells 21, with one cable being guided between every second row of solar cells 21 (viewed in the longitudinal direction of the column 1). In each case one connection to which the cables of the interconnection 13, 17 are connected is arranged on the front of the solar cells 21. For example, an MC4 connector (multicontact TwinBox with integrated MC4 connector) can be used as the connection.

The column 1 has holes 23 leading into the interior of the column 1, through which holes the interconnections 13, 17 are guided into the interior of the column 1. The cables of the interconnections 13, 17 are guided through the holes 23 into the interior of the column 1 (FIG. 2, left) and are connectable there to a converter and/or a storage unit. In an embodiment of the invention, in each case one hole 23 for the interconnections 13, 17 is provided for each row of solar cells 21.

In an embodiment of the invention, the column 1 has a cavity in which the converter and/or the storage unit is/are arranged.

In an embodiment of the invention, the interconnection 13, 17, in particular a cable of the interconnection 13, 17, is at least partially fixed, in particular by means of magnetic attachments and/or cable ducts integrated into the surface of the column 1.

In an further embodiment of the invention, the column 1 has a storage unit, in particular an accumulator, for storing the electrical energy, wherein the storage unit is connected to the at least one solar cell 21.

In an further embodiment of the invention, the storage unit and/or the converter is/are arranged in a cavity in the column 1.

Figure 2:
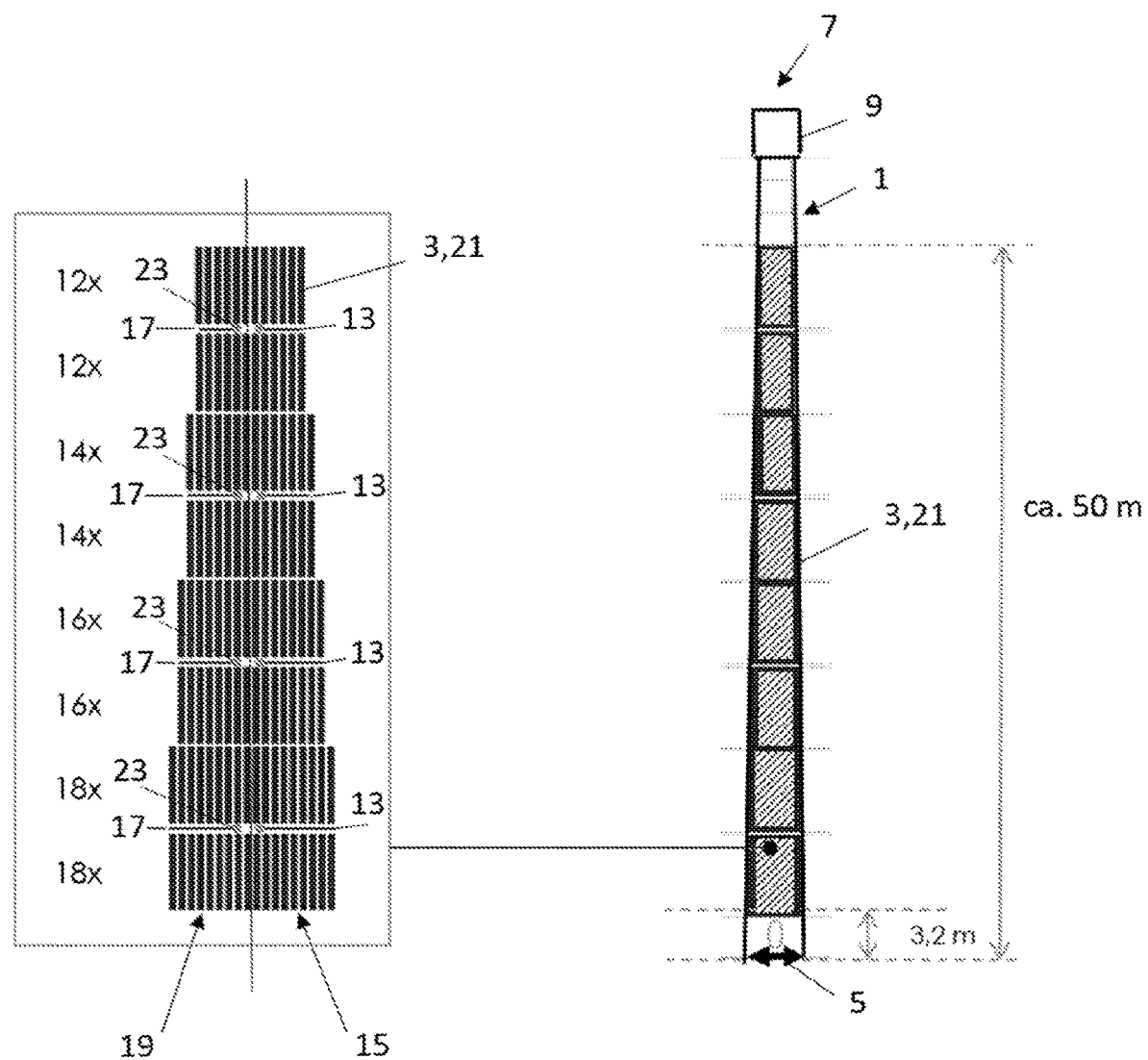
FIG. 2 shows a schematic illustration of a second embodiment of a wind turbine structure with flexible photovoltaic elements in a side view (FIG. 2, left) and an arrangement of photovoltaic elements attached thereto (FIG. 2, right)

FIG. 2 shows a schematic illustration of a second embodiment of a wind turbine structure 7 with flexible photovoltaic elements 3 in a side view (FIG. 2, right) and an arrangement of photovoltaic elements 3 attached thereto (FIG. 2, left). Identical and functionally identical elements are denoted with the same reference signs, and therefore reference is made in this regard to the description above.

The installation of the photovoltaic elements 3, that is to say the solar cells 21 (in the present exemplary embodiment HeliaSol® 6000), on the column 1 begins from a height of approx. 3 m of the column 1 and ends at a height of around 50 m of the column 1 (FIG. 2, right). Depending on the height of the column 1, it is also conceivable to install the solar cells 21 up to a greater height.

Owing to the conical shape, the diameter 5 of the column 1 decreases from the bottom to the top, as a result of which the surface area that is available in the form of a ring around the longitudinal direction of the column 1 decreases. The number of solar cells 21 arranged in the transverse direction to the column 1 therefore likewise decreases in the present exemplary embodiment from the bottom to the top. Eight rows of solar cells 21 are arranged on the surface of the column 1, wherein two adjoining rows in each case have the same number of solar cells 21. Eighteen solar cells 21 are arranged in each case in the first and second rows, wherein individual solar cells 21 are preferably located in each case mutually opposite, sixteen solar cells 21 are in each case arranged in the third and fourth rows, fourteen solar cells 21 are in each case arranged in the fifth and sixth rows, and twelve solar cells 21 are in each case arranged in the seventh and eighth rows. By using flexible solar cells 21, a form-fitting attachment of the solar cells 21 is possible even for a conically shaped column 1 despite a diameter 5 that decreases toward the top and an associated decreasing surface area.

The solar cells 21 are operatively connected, via the interconnection 13, 17, to an electrical subsystem, in particular a converter and/or a storage unit. The cables of the interconnection 13, 17 are connected to the solar cells 21 via connections, are guided into the interior of the column 1 via the holes 23, and are connected there to the converter and/or a storage unit.

In an embodiment of the invention, two rows of solar cells 21 arranged one next to another in the transverse direction to the column 1 in each case have the same number of solar cells 21. Such a pairwise arrangement of the solar cells 21 makes it possible to guide the cables of the interconnections 13, 17 between only every second row, as a result of which the installation of the solar cells 21 is made easier. The solar cells of every second row are preferably rotated through 180° relative to one another. Furthermore, for in each case two rows of solar cells 21, only one hole 23 is required through which the interconnection 13, 17 is guided into the interior of the column 1.

Figure 3:
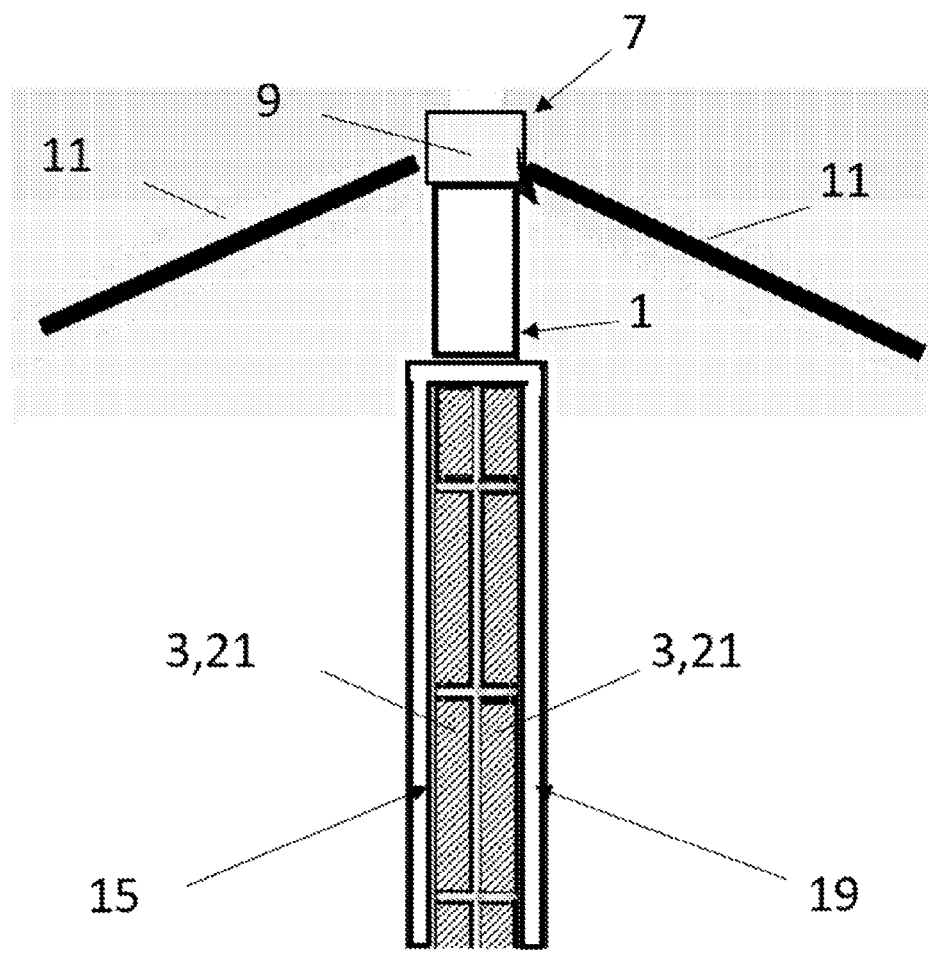
FIG. 3 shows a schematic illustration of a third embodiment of a wind turbine structure with flexible photovoltaic elements.

FIG. 3 shows a schematic illustration of a third embodiment of a wind turbine structure 7 with flexible photovoltaic elements 3. Identical and functionally identical elements are denoted with the same reference signs, and therefore reference is made in this regard to the description above.

In the present exemplary embodiment, the interconnection 17 of the solar cells 21 arranged in the east-south/east direction 19 is separated from the interconnection 13 of the solar cells 21 arranged in the west-south/west direction 15.

In an embodiment of the invention, the solar cells 21 are arranged at least largely over the entire surface of the column 1. It is conceivable that the surface of the column 1 is divided into more than two regions, in particular depending on the compass direction and/or any shading, wherein each region is assigned an interconnection, which means that further interconnections may exist in addition to the first interconnection 13 and second interconnection 17.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A device for converting radiation energy of light into electrical energy, the device comprising:
   a free-standing column supporting a wind turbine, the column being configured to float on water or being firmly installed to the ground; and
   at least one photovoltaic element disposed on the column, wherein the at least one photovoltaic element is a flexible photovoltaic element having a positive temperature coefficient, and
   wherein the at least one flexible photovoltaic element is attached to the column by an integral adhesive bond.

2. The device as claimed in claim 1, wherein the at least one flexible photovoltaic element is arranged transversely and/or longitudinally relative to the longest extent of the column.

3. The device as claimed in claim 1, wherein the column has at least two rows of flexible photovoltaic elements, wherein the at least two rows of flexible photovoltaic elements are arranged transversely and/or longitudinally relative to the longest extent of the column, and wherein a row has at least two flexible photovoltaic elements.

4. The device as claimed in claim 1, wherein the column has a conical shape, wherein a diameter of the column decreases at least partially from a bottom of the column to a top of the column.

5. The device as claimed in claim 1, wherein the flexible photovoltaic element is arranged in a form-fitting manner on the column.

6. A wind turbine structure for converting a flow energy of wind into electrical energy with the device of claim 1, wherein the wind turbine structure includes the column and a turbine portion with rotor blades, wherein the turbine portion is arranged at one end of the column, wherein a generator is drivable by means of the turbine portion, and wherein the at least one flexible photovoltaic element is arranged on the column.

7. The wind turbine structure as claimed in claim 6, wherein the at least one photovoltaic element is at least regionally arranged transversely around a longitudinal axis of the column, and wherein the at least one photovoltaic element is adhesively bonded to a surface of the column.

8. The wind turbine structure as claimed in claim 6, wherein the wind turbine structure has a multiplicity of flexible photovoltaic elements, wherein a first interconnection of flexible photovoltaic elements attached to a surface of the column in a first compass direction is separated from a second interconnection of flexible photovoltaic elements attached to the surface of the column in a second compass direction, and wherein the first interconnection and the second interconnection are each operated in an electrical working region.

9. A method for converting radiation energy of light into electrical energy, the method comprising:
   providing at least one flexible photovoltaic element disposed on a free-standing column supporting a wind turbine, wherein the column is arranged to float on water or arranged firmly installed to the ground, and wherein the at least one photovoltaic element is a flexible photovoltaic element having a positive temperature coefficient; and
   attaching the flexible photovoltaic element to the column by an integral adhesive bond.

10. The method for converting radiation energy of light into electrical energy as claimed in claim 9, the method further comprising:
    providing a wind turbine structure that includes a turbine portion with rotor blades;
    arranging the turbine portion at one end of the column; and
    driving a generator with the turbine portion.

11. The device as claimed in claim 1, wherein the flexible photovoltaic element is configured for attachment on a pre-existing surface of the column without addition of surfaces to the column.

12. The device as claimed in claim 1, wherein the flexible photovoltaic element is configured for attachment to the column without a frame or framework.

* * * * *